(12) United States Patent
Hoffman

(10) Patent No.: US 6,998,656 B2
(45) Date of Patent: Feb. 14, 2006

(54) TRANSPARENT DOUBLE-INJECTION FIELD-EFFECT TRANSISTOR

(75) Inventor: Randy Hoffman, Corvallis, OR (US)

(73) Assignee: Hewlett-Packard Development Company, L.P., Houston, TX (US)

(*) Notice: Subject to any disclaimer, the term of this patent is extended or adjusted under 35 U.S.C. 154(b) by 181 days.

(21) Appl. No.: 10/361,065

(22) Filed: Feb. 7, 2003

(65) Prior Publication Data

US 2004/0155270 A1   Aug. 12, 2004

(51) Int. Cl.
  H01L 29/745   (2006.01)
  H01L 29/76    (2006.01)
  H01L 29/74    (2006.01)
  H01L 27/148   (2006.01)
  H01L 29/768   (2006.01)

(52) U.S. Cl. .............. 257/214; 257/213; 257/224; 257/249; 257/250; 257/E31.126

(58) Field of Classification Search ........ 257/213, 257/214, 224, 249, 250, 331, E33.036, E31.126, 257/53, 57, 84; 357/19, 17, 2
See application file for complete search history.

(56) References Cited

U.S. PATENT DOCUMENTS

| | | | |
|---|---|---|---|
| 3,544,864 A | 12/1970 | Richman | |
| 4,458,261 A | 7/1984 | Omura | |
| 4,766,471 A * | 8/1988 | Ovshinsky et al. | 257/53 |
| 4,843,446 A * | 6/1989 | Nishino et al. | 257/32 |
| 4,882,295 A | 11/1989 | Czubatyj et al. | |
| 4,958,898 A * | 9/1990 | Friedman et al. | 385/3 |
| 5,128,731 A | 7/1992 | Lien et al. | |
| 5,132,676 A | 7/1992 | Kimura et al. | |
| 5,235,443 A | 8/1993 | Barnik et al. | |
| 5,295,009 A | 3/1994 | Barnik et al. | |

(Continued)

FOREIGN PATENT DOCUMENTS

EP    1134811 A1    9/2001

OTHER PUBLICATIONS

C. G. Granqvist, Progress in electrochromics : tungsten oxide revisited, Electrochimica Acta V. 44 (1999) pp. 3005-3015.

L. Bouteiller et al., Polymer-dispersed liquid crystals: Preparation, operation and application, Liquid Crystals, V. 21 (2) (1996) pp. 157-174.

(Continued)

Primary Examiner—Craig A. Thompson
Assistant Examiner—Heather Doty

(57) ABSTRACT

A double-injection field-effect transistor has an anode, a cathode, a substantially transparent channel, a substantially transparent gate insulator, and at least one substantially transparent gate electrode. The transistor may also have a substantially transparent anode and/or cathode. The transistor may also be formed on a substantially transparent substrate. Electrode contacts and electrical interconnection leads may also be substantially transparent. Methods for making and using such double-injection field-effect transistors are also disclosed.

74 Claims, 3 Drawing Sheets

U.S. PATENT DOCUMENTS

| | | | |
|---|---|---|---|
| 5,369,291 A * | 11/1994 | Swanson | 257/130 |
| 5,434,588 A | 7/1995 | Parker | |
| 5,744,864 A * | 4/1998 | Cillessen et al. | 257/49 |
| 5,850,123 A | 12/1998 | Potter | |
| 6,408,257 B1 | 6/2002 | Harrington et al. | |
| 6,503,831 B1 | 1/2003 | Speakman | |
| 2002/0105033 A1 * | 8/2002 | Zhang | 257/353 |
| 2003/0012870 A1 * | 1/2003 | Sakurada | 427/68 |

OTHER PUBLICATIONS

D. Coates, Polymer-dispersed Liquid Crystals, J. Mater. Chem. V. 5 (12) (1995) pp. 2063-2072.

M. Hack et al., Double-injection field-effect transistor: A new type of solid-state device, Appl. Phys. Letters V. 48 (20) (May 19, 1986) pp. 1386-1388.

M. Hack et al., Double-injection field-effect transistor: A new type of solid-state device, Mat. Res. Soc. Symp. Proc., V. 70 (1986) pp. 643-646.

Y. Omura, Lateral Unidirectional Bipolar-Type Insulated-Gate Transistors, 14th Conf. on Solid State Devices, Tokyo, 1982, Japanese J. Appl. Phys. V. 22. Suppl. 22-1 (1983) pp. 263-266.

* cited by examiner

TRANSPARENT DOUBLE-INJECTION FIELD-EFFECT TRANSISTOR

CROSS-REFERENCE TO RELATED APPLICATION

This application is related to co-pending and commonly assigned application Ser. No. 10/361,045, filed on the same date herewith, the entire disclosure of which is incorporated herein by reference.

TECHNICAL FIELD

This invention relates to transparent transistors and more particularly to transparent double-injection field-effect transistors.

BACKGROUND

Thin film transistors that have been used for driving display devices have generally comprised amorphous silicon, polycrystalline silicon, or the like. Since these materials exhibit photosensitivity to light in the visible spectrum, carriers are generated by incident light, and resistivity of a thin film in such transistors is lowered. For this reason, when the transistors are irradiated with light, the transistors may switch to an ON state, despite a need for the transistor to be controlled in an OFF state. Accordingly, heretofore, to keep the transistors at the OFF state when needed, the lowering of the carrier resistivity of the thin films due to the radiation by light has been prevented by the use of a light shielding layer made of a metal film or the like.

Liquid crystal display devices in particular have been widely used for portable electronic devices such as notebook personal computers. Requirements for such displays include high luminance, miniaturization, and energy saving. To meet these requirements, it is necessary to increase the area ratio of an effective emitting portion to the total area of each pixel in a display. However, the presence of a light shielding layer in the transistor for driving the liquid crystal display device as described above reduces the area ratio ("opening ratio") of the light transmission portion to the area of the light shielding layer in each pixel. Accordingly, a reduction of transistor area by improving performance of the transistor or an improvement of luminance of a backlight are necessary to develop a display device having high luminance. However, the measure to improve the performance characteristics of the transistor limits manufacturing yield, leading to an increase in cost. Moreover, the measure to improve the luminance of the backlight increases energy consumption. Thus, elimination of the need for a light shielding layer is desirable.

Double-injection field-effect transistors have been known for some years and their advantages over some other types of transistors are known. Heretofore, double-injection field-effect transistors have conventionally been made mostly from materials that are optically opaque.

In the field of displays and in other technological fields, there is a need for transparent transistors. Among the applications of displays employing transparent transistors are displays known as "heads-up" displays and "augmented reality" displays which allow a user to view a real environment beyond the screen of the display.

BRIEF DESCRIPTION OF THE DRAWINGS

The features and advantages of the disclosure will readily be appreciated by persons skilled in the art from the following detailed description when read in conjunction with the drawings, wherein.

Figure 1:
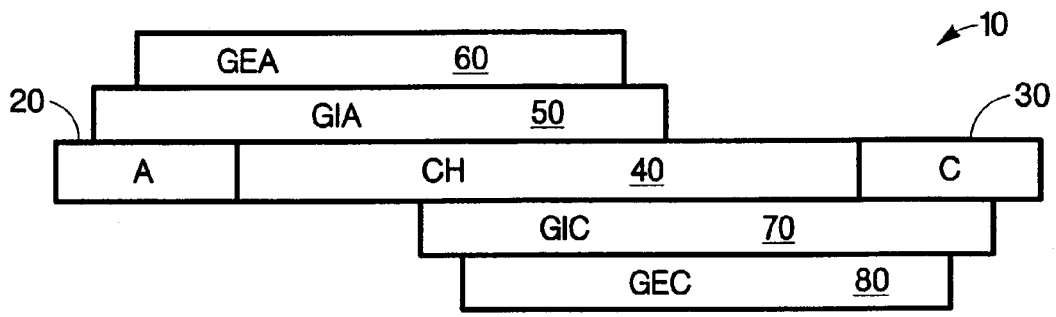
FIGS. 1–8 are side elevation cross-sections of various embodiments of field-effect transistors made in accordance with the invention.

The drawings are not drawn to any uniform scale. In particular, vertical and horizontal scales may differ from each other and may vary from one drawing to another.

DETAILED DESCRIPTION OF EMBODIMENTS

In the following detailed description, various embodiments of field-effect transistors made in accordance with the invention are described. Some embodiments are made entirely of substantially transparent materials. Some embodiments include some materials that are not transparent, but in specific applications these embodiments also provide benefits accruing from at least partial transparency. The terms "transparent" and "transparency" as used in the present specification and the appended claims means having substantial transmittance in some spectral range. Thus, in the sense used here, "transparent" and "transparency" include translucence. The spectral range of transparency may be in the visible portion of the electromagnetic spectrum, or in a non-visible portion of the electromagnetic spectrum such as the infrared portion, or may extend through portions of both visible and non-visible spectral ranges.

In accordance with the present invention, all of the embodiments illustrated in FIGS. 1–8 include a field-effect transistor 10 having an anode 20, a cathode 30, a substantially transparent channel 40, at least one substantially transparent gate insulator 50, 70, and/or 90, and at least one substantially transparent gate electrode 60, 80, and/or 100. The anode 20 and/or the cathode 30 of transistor 10 may also be substantially transparent. The transistor may also be formed on a substantially transparent substrate 15. Electrode contacts and electrical interconnection leads (otherwise conventional and not shown in the drawings) may also be substantially transparent.

The "stack" consisting of the channel 40, gate insulators 50, 70, and/or 90, and gate electrodes 60, 80, and/or 100 should in general be substantially transparent, but for some applications, one or both of the anode and cathode may be made opaque, without losing the advantages of transparency in the remainder of the device.

FIG. 1 shows an embodiment of a field-effect transistor 10 with a single anode 20, a single cathode 30 spaced apart from the anode, and a channel 40 extending across the space between the anode and cathode to conduct carriers. An anode gate insulator 50 at least partially covers channel 40, overlapping a region of channel 40 adjacent to anode 20. An anode gate electrode 60 extends over anode gate insulator 50 and overlaps a region of channel 40 adjacent to anode 20. Optionally, anode gate electrode 60 may overlap at least part of anode 20, as shown in FIG. 1. Similarly, a cathode gate insulator 70 at least partially covers channel 40, overlapping a region of channel 40 adjacent to cathode 30. A cathode gate electrode 80 extends over cathode gate insulator 70 and overlaps a region of channel 40 adjacent to cathode 30.

Optionally, cathode gate electrode 80 may overlap at least part of cathode 30, as shown in FIG. 1.

An electrical bias voltage applied to anode gate electrode 60 can control a current of carriers in channel 40 near anode 20. Similarly, a separate electrical bias voltage applied to cathode gate electrode 80 can control a current of carriers in channel 40 near cathode 30. Thus, the embodiment shown in FIG. 1 has four terminals: anode 20, cathode 30, anode gate electrode 60, and cathode gate electrode 80.

Channel 40, anode gate insulator 50, anode gate electrode 60, cathode gate insulator 70, and cathode gate electrode 80 are substantially transparent.

Either anode 20 or cathode 30 may also be made substantially transparent, thereby increasing the fractional portion of the field-effect device that is transparent. If both the anode and cathode are formed of transparent conductors or transparent semiconductors, the field-effect transistor 10 may be made entirely transparent. In any case, the transparent portions of field-effect transistor device 10 may be aligned over a light-emissive or light-transmissive portion of a display pixel, for example, providing a high fill factor. A display comprising an array of pixel elements may be made with one or more such field-effect transistors in each pixel element.

Anode gate electrode 60 and cathode gate electrode 80 may or may not partially overlap one another. If anode gate electrode 60 and cathode gate electrode 80 overlap one another at least partially (as shown in FIG. 1), they are disposed facing opposite surfaces of the channel layer 40 (as shown in FIG. 1). If anode gate electrode 60 and cathode gate electrode 80 do not overlap one another, they may be disposed facing opposite surfaces or on the same surface of the channel 40.

Generally, the embodiment of a field-effect transistor device 10 of FIG. 1 is operable by double injection: injection of positive carriers (holes) from anode 20 into channel 40, and injection of negative carriers (electrons) from cathode 30 into channel 40. Anode 20 is capable of extracting electrons from channel 40, is not capable of injecting electrons into channel 40, and is optionally capable of injecting holes into channel 40. Cathode 30 is capable of extracting holes from channel 40, is not capable of injecting holes into channel 40, and is optionally capable of injecting electrons into channel 40. One or both of the anode and cathode are capable of injecting carriers (electrons or holes) into channel 40 in accordance with the restrictions described above.

Materials suitable for anode 20, cathode 30, channel 40, anode gate insulator 50, anode gate electrode 60, cathode gate insulator 70, and cathode gate electrode 80 are described hereinbelow, in the section titled "FABRICATION."

Figure 2:
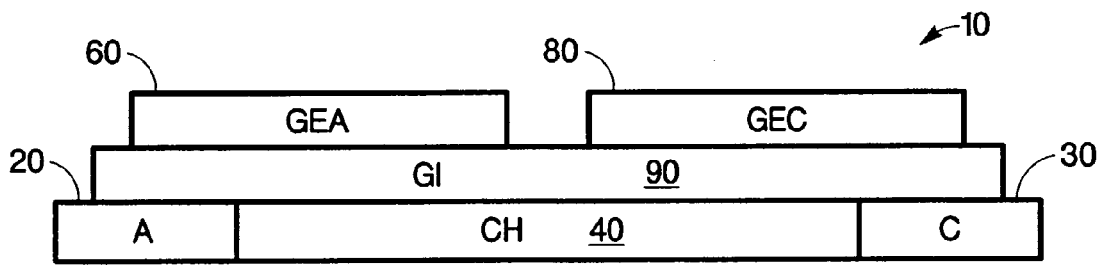

FIG. 2 shows another embodiment of a field-effect transistor 10 made in accordance with the invention. The embodiment of FIG. 2 is a general double-gate (non-overlapping) device structure having four terminals (anode 20, cathode 30, anode gate electrode 60, and cathode gate electrode 80.) A single gate insulator 90 extends over the entire length of channel 40. Anode gate electrode 60 and cathode gate electrode 80 are disposed facing the same side of channel 40, but laterally spaced apart from each other. Anode gate electrode 60 at least partially overlaps channel 40, optionally overlapping at least part of anode 20. Cathode gate electrode 80 at least partially overlaps channel 40, optionally overlapping at least part of cathode 30.

Figure 3:
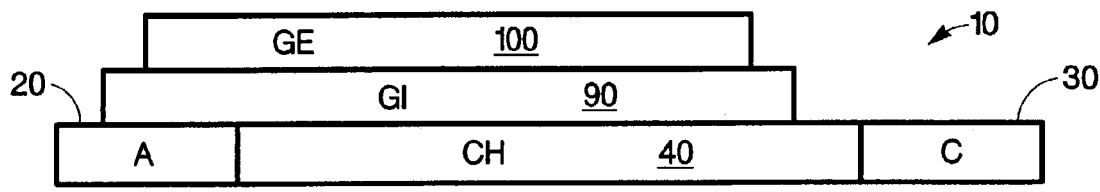

FIG. 3 shows a third embodiment of a field-effect transistor 10 made in accordance with the invention. The embodiment of FIG. 3 illustrates a general single-gate structure having three terminals (anode 20, cathode 30, and a single gate electrode 100). Gate electrode 100 at least partially overlaps channel 40, optionally overlapping at least part of anode 20 and optionally overlapping at least part of cathode 30.

While FIGS. 1–3 do not show a substrate, those skilled in the art will recognize that the devices shown may be formed on a substrate. The substrate (shown in FIGS. 4–8 and identified with reference numeral 15) may also be substantially transparent. In some applications, it may be convenient to form field-effect transistor 10 on a substrate 15, and then remove the substrate, e.g., by conventional chemical etching or conventional chemical-mechanical polishing. In some applications, channel 40 may be formed in a substrate, whereby it may be made with a channel surface substantially flush with a surface of the substrate. In such cases, if the substrate is sufficiently thin, the entire thickness of the substrate may be occupied by channel 40.

Figure 4:
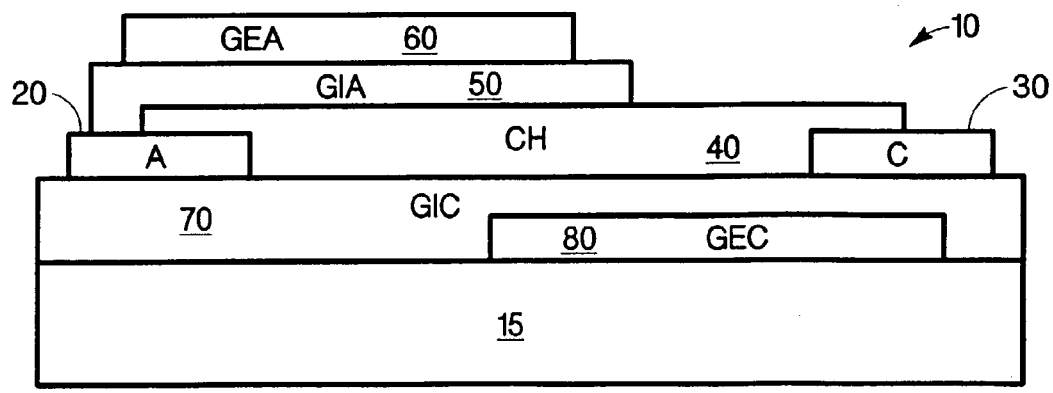

FIG. 4 shows a side elevation cross-section of a fourth embodiment of a field-effect transistor 10 made on a substrate 15 in accordance with the invention. This embodiment is an exemplary double-gate (overlapping) device structure with four terminals: anode 20, cathode 30, anode gate electrode 60, and cathode gate electrode 80. Channel 40 at least partially overlaps anode 20 and cathode 30. The channel length is defined by the separation between anode 20 and cathode 30. Anode gate electrode 60 at least partially overlaps channel 40 and optionally overlaps at least part of anode 20. Cathode gate electrode 80 overlaps at least part of channel 40 and optionally overlaps at least part of cathode 30. In this embodiment, the anode 20, cathode 30, and channel 40 may be layered in any order.

Figure 5:
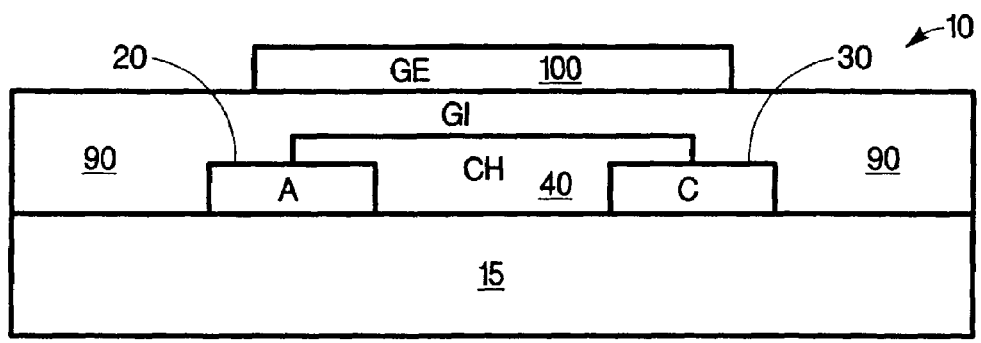

FIG. 5 shows a side elevation cross-section of a fifth embodiment of a field-effect transistor 10 made on a substrate 15 in accordance with the invention. This embodiment is an exemplary single-top-gate device structure with three terminals: anode 20, cathode 30, and a single gate electrode 100. Channel 40 at least partially overlaps both anode 20 and cathode 30. The channel length is defined by the separation between anode and cathode. Gate electrode 100 overlaps at least part of channel 40, optionally overlaps at least part of anode 20, and optionally overlaps at least part of cathode 30. Anode 20, cathode 30, and channel 40 may be layered in any order.

Figure 6:
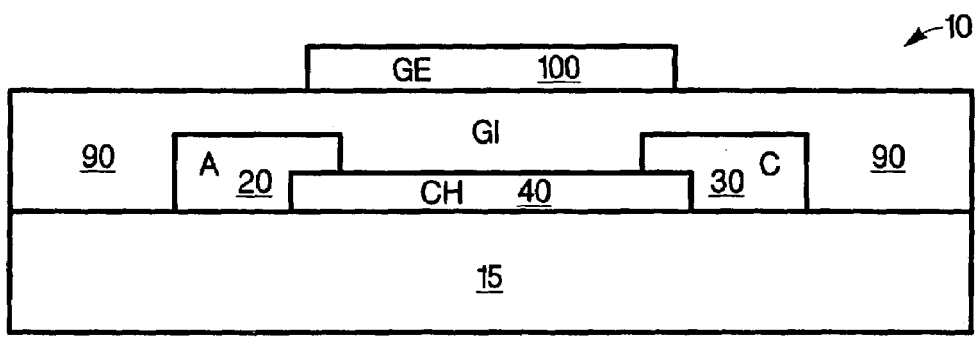

This layer-ordering flexibility is illustrated by FIG. 6, which shows a side elevation cross-section of a sixth embodiment of a field-effect transistor 10 made on a substrate 15 in accordance with the invention. This embodiment is an exemplary single-top-gate device structure with three terminals: anode 20, cathode 30, and a single gate electrode 100. Channel 40 at least partially overlaps both anode 20 and cathode 30. The channel length is defined by the separation between anode and cathode. Gate electrode 100 overlaps at least part of channel 40, optionally overlaps at least part of anode 20, and optionally overlaps at least part of cathode 30. Anode 20, cathode 30, and channel 40 may be layered in any order. Thus, in FIG. 6, anode 20, cathode 30, and channel 40 are layered in a different order from the order used to form the embodiment shown in FIG. 5.

Figure 7:
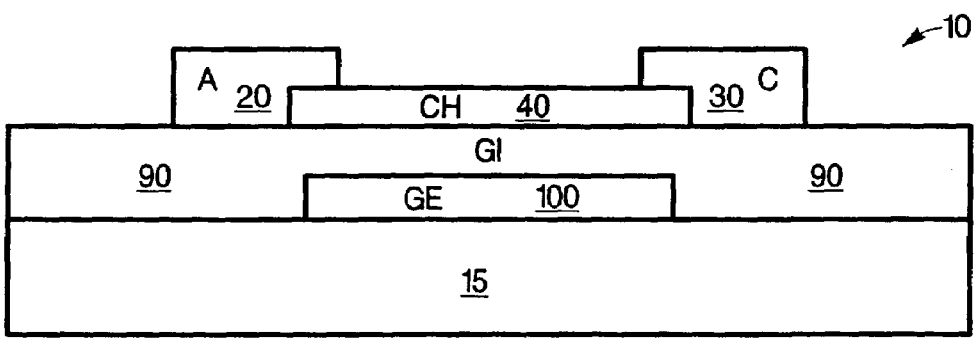

FIG. 7 shows a side elevation cross-section of a seventh embodiment of a field-effect transistor 10 made on a substrate 15 in accordance with the invention. This embodiment is an exemplary single-bottom-gate device structure with three terminals: anode 20, cathode 30, and a single gate electrode 100. Channel 40 at least partially overlaps both anode 20 and cathode 30. The channel length is defined by the separation between anode and cathode. Gate electrode 100 overlaps at least part of channel 40, optionally overlaps at least part of anode 20, and optionally overlaps at least part of cathode 30. Anode 20, cathode 30, and channel 40 may be layered in any order.

Figure 8:
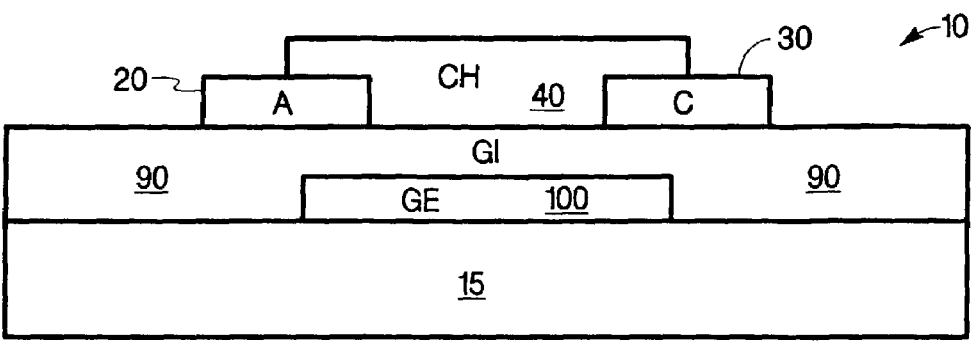

FIG. 8 shows a side elevation cross-section of an eighth embodiment of a field-effect transistor 10 made on a substrate 15 in accordance with the invention.

This embodiment is an exemplary single-bottom-gate device structure with three terminals: anode 20, cathode 30, and a single gate electrode 100. Channel 40 at least partially overlaps both anode 20 and cathode 30. The channel length is defined by the separation between anode and cathode. Gate electrode 100 overlaps at least part of channel 40, optionally overlaps at least part of anode 20, and optionally overlaps at least part of cathode 30. Anode 20, cathode 30, and channel 40 may be layered in any order.

Gate electrode 100 as shown in FIGS. 7 and 8 may be considered a buried electrode as it is covered by other elements of the device structure. In practice, electrical connections to such a buried electrode are made by conventional via openings filled with conductive material and connecting to external connections.

The conventional interconnection leads needed to provide external connections to all the device terminals are not shown in the drawings. Those skilled in the art will recognize that such interconnection leads may be made substantially transparent through the use of transparent conductors. Such substantially transparent interconnection leads are electrically coupled to each of the anode 20, cathode 30, and each gate electrode 60, 80, or 100.

To make a substantially transparent field-effect transistor based on any one of the embodiments of FIGS. 1–8, the device includes a substantially transparent substrate, a substantially transparent anode, a substantially transparent cathode, a substantially transparent channel adapted to selectively conduct carriers between the anode and the cathode (which are spaced apart), at least one substantially transparent gate electrode adapted for controlling current in the channel, a substantially transparent gate insulator, and a substantially transparent interconnection lead electrically coupled to each of the anode, cathode, and gate electrode. The substantially transparent field-effect transistor is made to be operable by double injection.

Irrespective of transparency, a related device structure employs a source contact that is capable of injecting carriers (electrons for an n-channel device or holes for a p-channel device) into the channel (as in a conventional field-effect transistor), whereas the drain contact can efficiently extract carriers from the channel but cannot inject either carrier type into the channel region. A blocking interface is formed for injection into the channel from this drain contact. Although the forward current flow of this device is essentially identical to that of a conventional field-effect transistor, reverse current flow is suppressed (as for the double-injection field-effect transistor) due to the fact that neither contact (source or drain) is able to supply carriers to the channel for current flow in the reverse direction. Such a blocking contact may be formed by a Schottky diode junction, for example.

By forming a blocking contact for injection of the appropriate carrier type at either anode 20 or cathode 40, a field-effect transistor may be formed with a channel 40 adapted to selectively conduct carriers between the anode and the cathode and wherein only one of the anode and cathode is adapted to inject carriers into the channel. Carrier injection from the other is blocked. The transistor has at least one gate electrode 60, 80, or 100 adapted for controlling current in the channel; and at least one gate insulator 50, 70, or 90. As in the other embodiments described, the channel, gate insulator, and gate electrode may all be made substantially transparent. If full transparency is desired, the anode and cathode may also be made substantially transparent.

Fabrication

Figure 9:
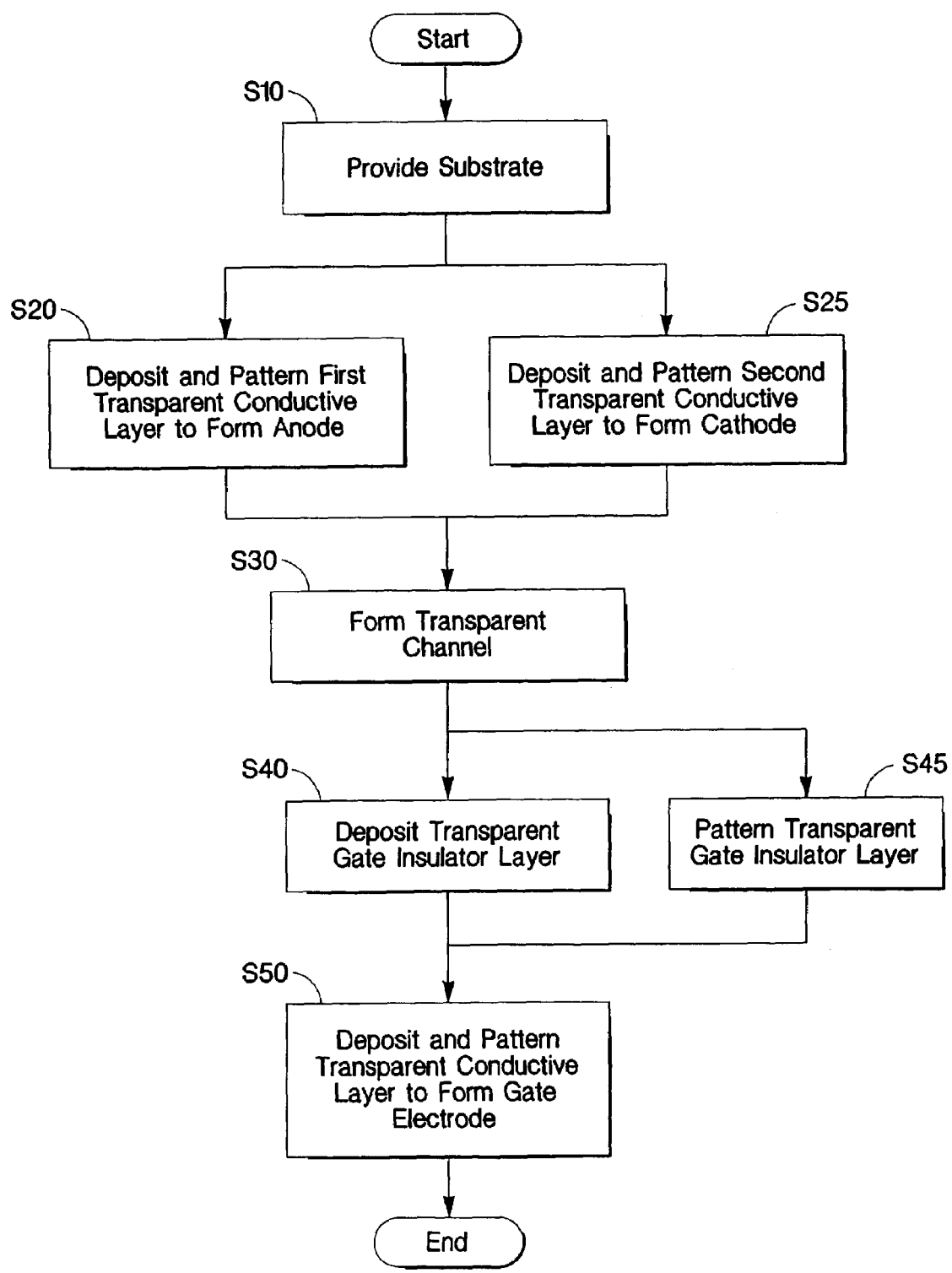
FIG. 9 is a flow chart illustrating an embodiment of a fabrication method performed in accordance with the invention.

FIG. 9 shows an embodiment of a method for fabricating a double-injection field-effect transistor in accordance with the invention. Reference numerals S10–S50 denote steps of the method embodiment illustrated. A suitable substrate 15 is provided (step S10). Suitable transparent substrate materials include sapphire ($Al_2O_3$), glass, and silicon dioxide. In step S20, a first conductive layer is deposited and patterned to form an anode 20. Anode 20 may be formed of a p-type semiconductor (e.g., NiO, $CuO_x$, $SrCu_2O_2$, $BaCu_2S_2$, LaCuOS, $CuAlO_2$, $CuYO_2$, $CuScO_2$, or $CuCrO_2$) or may be formed of a high work function metal (e.g., Au, Pt, or Ni). In step S25, a second conductive layer is deposited and patterned to form a cathode 30 spaced apart from the anode.

Cathode 30 may be formed of an n-type semiconductor (e.g., $In_2O_3$, $SnO_2$, ZnO, or GaN) or of low work function metal (e.g., Ca, Li, Na, or $LaB_6$). In some embodiments, steps S20 and S30 can be performed simultaneously by depositing and patterning a single conductive layer suitable for both anode and cathode. In step S30, a transparent channel extending at least between the anode and cathode is formed. Channel 40 may be formed of a transparent semiconductor (e.g., $In_2O_3$, $SnO_2$, ZnO, GaN, NiO, $SrCu_2O_2$, $BaCu_2S_2$, LaCuOS, $CuAlO_2$, $CuYO_2$, $CuScO_2$, $CuCrO_2$, $CuInO_2$, ZnS, BaS, or SrS) and may be insulating, semi-insulating, or lightly doped (n-type or p-type). At least one thin transparent insulating layer is deposited (step S40) and optionally patterned (step S45) to form at least one gate insulator 50, 70, or 90. In the embodiments of FIGS. 7 and 8, for example, it may not be necessary to pattern the gate insulator. Gate insulators 50, 70, and 90 are formed of a wide-bandgap insulator (e.g., $SiO_x$, $SiN_x$, $SiO_xN_y$, $AlO_x$, or $TaO_x$); such wide-bandgap insulators are generally transparent. The thickness of the gate insulators 50, 70, and 90 should be less than about 500 nanometers for conventional dielectrics. The thickness may be made less than 50 nm for some gate insulator materials and may be more that 500 nanometers for high-k dielectrics used as the gate insulator.

In step S50, at least one transparent conductive layer is deposited and patterned to form at least one gate electrode 60, 80, or 100 overlapping at least a portion of the transparent channel 40 and at least partially aligned with the gate insulator. Gate electrodes 60, 80, and 100 are formed of a metal (e.g., Au, Al, Cu, In, Ti, W, Ni, or Pt) or doped semiconductor (e.g., $In_2O_3$, $SnO_2$, or ZnO), optionally transparent.

Those skilled in the art will readily understand that the order of these steps may be varied according to the details of the embodiment to be fabricated, as in the examples of FIGS. 5 and 6 and FIGS. 7 and 8, which have different layer orders. The order of steps may also depend on whether there is to be a top or bottom gate or both, which side of the completed device is to be adjacent to the substrate, etc.

In applications to displays, a substrate including a previously formed pixel element may be provided. Then steps of depositing and patterning first and second transparent conductive layer(s) to form anode 20 and cathode 30 includes at least partially aligning the anode and cathode with the previously formed pixel element. Thus, practice of the present invention provides a method for using a substantially transparent double-injection field-effect transistor in an array of pixel elements of a display. An array of substantially transparent double-injection field-effect transistors (one or more per pixel element) is formed as described above, aligned with the pixels of the display.

Specifically, a method of using a substantially transparent double-injection field-effect transistor includes forming an array of pixel elements for a display, forming at least one substantially transparent double-injection field-effect transistor in at least partial alignment with each pixel element of the array and electrically coupled with each pixel element, and controlling each pixel element of the array with the field-effect transistor corresponding to the pixel element.

While the invention should not be construed as being limited to the consequences of any particular theory of operation, principles of light transmittance through thin films are quite well understood by those skilled in the art and are believed to apply to the embodiments described herein. Generally, light that is reflected at an interface or absorbed within a particular film is not transmitted. Thus, conventional anti-reflection coatings may be beneficial for some applications of the invention to reduce or prevent reflection and therefore allow increased transmission. Materials may be selected for low absorption coefficient and film thicknesses may be kept sufficiently small to reduce undesirable absorption to an acceptable level.

In a broad sense, one aspect of the invention is a field-effect transistor structure comprising an anode, a cathode spaced apart from the anode, a substantially transparent channel adapted to selectively conduct carriers between the anode and the cathode, a substantially transparent gate electrode adapted for controlling current in the channel, and a substantially transparent gate insulator, the field-effect transistor being adapted to be operable by double injection.

As mentioned hereinabove, a transparent display having an array of pixel elements may be made in which each pixel element of the display has at least one such double-injection field-effect transistor. Field-effect transistors made in accordance with the invention can be used to make an integrated circuit, a substrate with microelectronics, or an electronic device, in addition to the displays discussed above.

Another aspect of the invention is a double-injection field-effect transistor structure including a substantially transparent substrate and substantially transparent anode and cathode. Yet another aspect of the invention is a field-effect transistor having first and second gate electrodes, both adapted for controlling current in the channel and at least one substantially transparent gate insulator. Yet another aspect of the invention is a field-effect transistor in which only one of the anode and cathode is adapted to inject carriers into the channel, the other electrode having injection blocked.

Another aspect of the invention is a method for fabricating a double-injection field-effect transistor, the method embodiment described and illustrated above and its variations.

INDUSTRIAL APPLICABILITY

The transparent double-injection transistor and associated methods are especially useful in displays such as liquid-crystal displays and in display applications such as heads-up displays and augmented reality displays.

Although the foregoing has been a description and illustration of specific embodiments of the invention, various modifications and changes thereto can be made by persons skilled in the art without departing from the scope and spirit of the invention as defined by the following claims. For example, the order of process steps may be varied, multiple layers of transparent transistors may be stacked with interlayer dielectrics separating the layers, and the transparent device structures may be applied for other purposes, such as switchable holograms or reconfigurable optical filters.

What is claimed is:

1. A field-effect transistor, comprising:
   a) an anode;
   b) a cathode spaced apart from the anode;
   c) a substantially transparent channel adapted to selectively conduct carriers between the anode and the cathode;
   d) a substantially transparent gate electrode adapted for controlling current in the substantially transparent channel; and
   e) a substantially transparent gate insulator,
   the field-effect transistor being adapted to be operable by double injection.

2. A display comprising an array of pixel elements, each pixel element of the display comprising the field-effect transistor of claim 1.

3. An integrated circuit comprising the field-effect transistor of claim 1.

4. A substrate with microelectronics comprising the field-effect transistor of claim 1.

5. An electronic device comprising the field-effect transistor of claim 1.

6. The field-effect transistor of claim 1, further comprising a substrate.

7. The field-effect transistor of claim 6, wherein the substrate is substantially transparent.

8. The field-effect transistor of claim 6, wherein the channel is disposed in the substrate.

9. The field-effect transistor of claim 8, wherein the substrate has a surface and the channel is flush with the surface of the substrate.

10. The field-effect transistor of claim 1, wherein the anode is substantially transparent.

11. The field-effect transistor of claim 1, wherein the cathode is substantially transparent.

12. The field-effect transistor of claim 1, further comprising a substantially transparent interconnection lead electrically coupled to each of the anode, cathode, and gate electrode.

13. A double-injection field-effect transistor formed entirely of substantially transparent materials.

14. A transparent display comprising an array of pixel elements, each pixel element of the display comprising the double-injection field-effect transistor of claim 13.

15. A field-effect transistor, comprising:
   a) a substantially transparent substrate;
   b) a substantially transparent anode and anode contact;
   c) a substantially transparent cathode and cathode contact, the cathode being spaced apart from the anode;
   d) a substantially transparent channel adapted to selectively conduct carriers between the anode and the cathode;
   e) a substantially transparent gate electrode adapted for controlling current in the channel;
   f) a substantially transparent gate insulator; and
   g) a substantially transparent interconnection lead electrically coupled to each of the anode, cathode, and gate,
   the field-effect transistor being adapted to be operable by double injection.

16. A transparent display comprising an array of pixel elements, each pixel element of the display comprising a field-effect transistor as recited in claim 15.

17. An integrated circuit comprising the field-effect transistor of claim 15.

18. A substrate with microelectronics comprising the field-effect transistor of claim 15.

19. An electronic device comprising the field-effect transistor of claim 15.

20. A field-effect transistor, comprising:
a) an anode;
b) a cathode spaced apart from the anode;
c) a substantially transparent channel adapted to selectively conduct carriers between the anode and the cathode;
d) first and second gate electrodes adapted for controlling current in the channel; and
e) at least one substantially transparent gate insulator, the field-effect transistor being adapted to be operable by double injection.

21. An integrated circuit comprising the field-effect transistor of claim 20.

22. A substrate with microelectronics comprising the field-effect transistor of claim 20.

23. An electronic device comprising the field-effect transistor of claim 20.

24. A display comprising an array of pixel elements, each pixel element of the display comprising the field-effect transistor of claim 20.

25. The field-effect transistor of claim 20, wherein the anode is substantially transparent.

26. The field-effect transistor of claim 20, wherein the cathode is substantially transparent.

27. The field-effect transistor of claim 20, further comprising a substrate.

28. The field-effect transistor of claim 27, wherein the substrate is substantially transparent.

29. The field-effect transistor of claim 27, wherein the channel is disposed in the substrate.

30. The field-effect transistor of claim 29, wherein the substrate has a surface and the channel is substantially flush with the surface of the substrate.

31. The field-effect transistor of claim 20, wherein at least one of the first and second gate electrodes is substantially transparent.

32. The field-effect transistor of claim 20, wherein both the first and second gate electrodes are substantially transparent.

33. The field-effect transistor of claim 20, further comprising a substantially transparent interconnection electrically coupled to each of the anode, cathode, first gate electrode, and second gate electrode.

34. The field-effect transistor of claim 20, including first and second gate insulators.

35. The field-effect transistor of claim 34, wherein only one of the first and second gate insulators is substantially transparent.

36. The field-effect transistor of claim 34, wherein both the first and second gate insulators are substantially transparent.

37. The field-effect transistor of claim 34, wherein the first and second gate insulators are disposed on the same side of the substantially transparent channel.

38. The field-effect transistor of claim 37, wherein the first and second gate electrodes are disposed in contact with the first and second gate insulators respectively.

39. The field-effect transistor of claim 34, wherein the first and second gate electrodes are disposed facing the same side of the substantially transparent channel.

40. The field-effect transistor of claim 34, wherein the first and second gate insulators are disposed on opposite sides of the substantially transparent channel.

41. The field-effect transistor of claim 40, wherein the first and second gate electrodes are disposed in contact with the first and second gate insulators respectively.

42. The field-effect transistor of claim 34, wherein the first and second gate electrodes are disposed facing opposite sides of the substantially transparent channel.

43. The field-effect transistor of claim 20, wherein at least one of the first and second gate electrodes overlaps at least a portion of the substantially transparent channel adjacent to the anode.

44. The field-effect transistor of claim 20, wherein at least one of the first and second gate electrodes overlaps at least a portion of the substantially transparent channel adjacent to the cathode.

45. The field-effect transistor of claim 20, wherein the channel has an effective length defined by the separation between the anode and the cathode.

46. The field-effect transistor of claim 20, wherein the anode is adapted to inject positive carriers into the channel.

47. The field-effect transistor of claim 20, wherein the cathode is adapted to inject negative carriers into the channel.

48. A field-effect transistor, comprising:
a) substantially transparent anode means for injecting positive carriers and extracting negative carriers;
b) substantially transparent cathode means for injecting negative carriers and extracting positive carriers;
c) substantially transparent means adapted to selectively conduct carriers between the anode means and the cathode means;
d) first and second means for controlling current, at least one of the first and second means for controlling current being substantially transparent; and
e) at least one substantially transparent means for insulating the first and second means for controlling current from the substantially transparent means adapted to selectively conduct carriers,
the field-effect transistor being adapted to be operable by double injection.

49. A display comprising an array of pixel elements, each pixel element of the display comprising the field-effect transistor of claim 48.

50. A field-effect transistor, comprising:
a) an anode;
b) a cathode spaced apart from the anode;
c) a substantially transparent channel adapted to selectively conduct carriers between the anode and the cathode;
d) first and second gate electrodes adapted for controlling current in the channel, the first gate electrode overlapping at least a portion of the channel adjacent to the anode and the second gate electrode overlapping at least a portion of the channel adjacent to the cathode; and
e) at least one substantially transparent gate insulator, the field-effect transistor being adapted to be operable by double injection.

51. An integrated circuit comprising the field-effect transistor of claim 50.

52. A substrate with microelectronics comprising the field-effect transistor of claim 50.

53. An electronic device comprising the field-effect transistor of claim 50.

54. A display comprising an array of pixel elements, each pixel element of the display comprising the field-effect transistor of claim 50.

55. The field-effect transistor of claim 50, wherein the anode is substantially transparent.

56. The field-effect transistor of claim 50, wherein the cathode is substantially transparent.

57. The field-effect transistor of claim 50, further comprising a substrate.

58. The field-effect transistor of claim 57, wherein the substrate is substantially transparent.

59. The field-effect transistor of claim 57, wherein the channel is disposed in the substrate.

60. The field-effect transistor of claim 59, wherein the substrate has a surface and the channel is substantially flush with the surface of the substrate.

61. The field-effect transistor of claim 50, wherein at least one of the first and second gate electrodes is substantially transparent.

62. The field-effect transistor of claim 50, wherein both the first and second gate electrodes are substantially transparent.

63. The field-effect transistor of claim 50, further comprising a substantially transparent interconnection electrically coupled to each of the anode, cathode, first gate electrode, and second gate electrode.

64. The field-effect transistor of claim 50, including first and second gate insulators.

65. The field-effect transistor of claim 64, wherein only one of the first and second gate insulators is substantially transparent.

66. The field-effect transistor of claim 64, wherein both the first and second gate insulators are substantially transparent.

67. The field-effect transistor of claim 64, wherein the first and second gate insulators are disposed on the same side of the substantially transparent channel.

68. The field-effect transistor of claim 67, wherein the first and second gate electrodes are disposed in contact with the first and second gate insulators respectively.

69. The field-effect transistor of claim 64, wherein the first and second gate electrodes are disposed facing the same side of the substantially transparent channel.

70. The field-effect transistor of claim 64, wherein the first and second gate insulators are disposed on opposite sides of the substantially transparent channel.

71. The field-effect transistor of claim 70, wherein the first and second gate electrodes are disposed in contact with the first and second gate insulators respectively.

72. The field-effect transistor of claim 64, wherein the first and second gate electrodes are disposed facing opposite sides of the substantially transparent channel.

73. A field-effect transistor, comprising:
a) an anode;
b) a cathode spaced apart from the anode;
c) a substantially transparent channel adapted to selectively conduct carriers between the anode and the cathode;
d) first and second gate electrodes adapted for controlling current in the channel; and
e) at least one substantially transparent gate insulator comprising a wide-bandgap insulator,
the field-effect transistor being adapted to be operable by double injection.

74. A field-effect transistor, comprising:
a) an anode;
b) a cathode spaced apart from the anode, only one of the anode and cathode being adapted to inject carriers into the channel;
c) a substantially transparent channel adapted to selectively conduct carriers between the anode and the cathode;
d) first and second gate electrodes adapted for controlling current in the channel; and
e) at least one substantially transparent gate insulator,
the field-effect transistor being adapted to be operable by double infection.

* * * * *

UNITED STATES PATENT AND TRADEMARK OFFICE
CERTIFICATE OF CORRECTION

PATENT NO. : 6,998,656 B2 Page 1 of 1
APPLICATION NO. : 10/361065
DATED : February 14, 2006
INVENTOR(S) : Hoffman It is certified that error appears in the above-identified patent and that said Letters Patent is hereby corrected as shown below:

In the Claims

Col. 12 (line 40), delete "infection" and insert therefor --injection--.

Signed and Sealed this

Twenty-third Day of January, 2007

JON W. DUDAS
*Director of the United States Patent and Trademark Office*